United States Patent [19]

Smith et al.

[11] Patent Number: 5,223,787

[45] Date of Patent: Jun. 29, 1993

[54] HIGH-SPEED, LOW-PROFILE TEST PROBE

[75] Inventors: Monty Smith, Forest Grove; Garry P. Liddell, Portland; James E. Trimble, Hillsboro; David G. Payne, Aloha, all of Oreg.

[73] Assignee: Tektronix, Inc., Wilsonville, Oreg.

[21] Appl. No.: 890,216

[22] Filed: May 29, 1992

[51] Int. Cl.⁵ .............................................. G01R 1/04
[52] U.S. Cl. ................................. 324/158 P; 324/72.5; 439/482
[58] Field of Search ............. 324/158 R, 158 F, 158 P, 324/72.5; 439/482

[56] References Cited

U.S. PATENT DOCUMENTS

| | | | |
|---|---|---|---|
| 4,853,624 | 8/1989 | Rabjohn | 324/158 P |
| 4,952,872 | 8/1990 | Driller et al. | 324/72.5 |

Primary Examiner—Vinh Nguyen
Attorney, Agent, or Firm—William K. Bucher

[57] ABSTRACT

A high-speed, low-profile logic analyzer test probe has a body of insulating material molded directly onto a narrow elongate substrate having electrical circuitry disposed thereon. The molded insulating material has a notch formed therein for exposing a conductive surface formed on the substrate. The exposed conductive surface is used for making a ground connection between the substrate and the ground of a device under test. The probe may be adapted for use in probe holder for multichannel probing wherein the probe holder has an electrically conductive chip disposed within the probe holder housing for providing the shortest possible ground connections between the ground pins on the device under test and the ground connections on the probes.

7 Claims, 7 Drawing Sheets

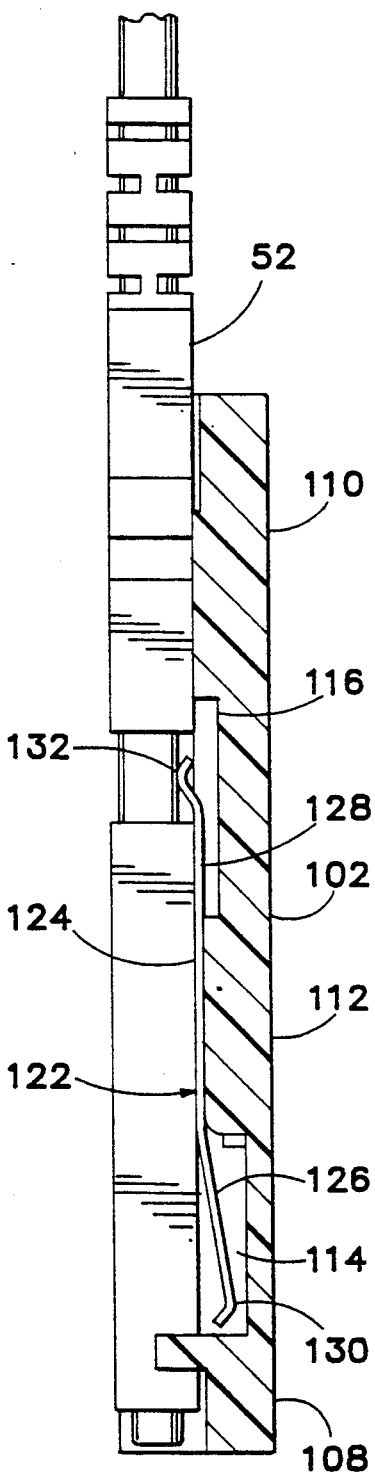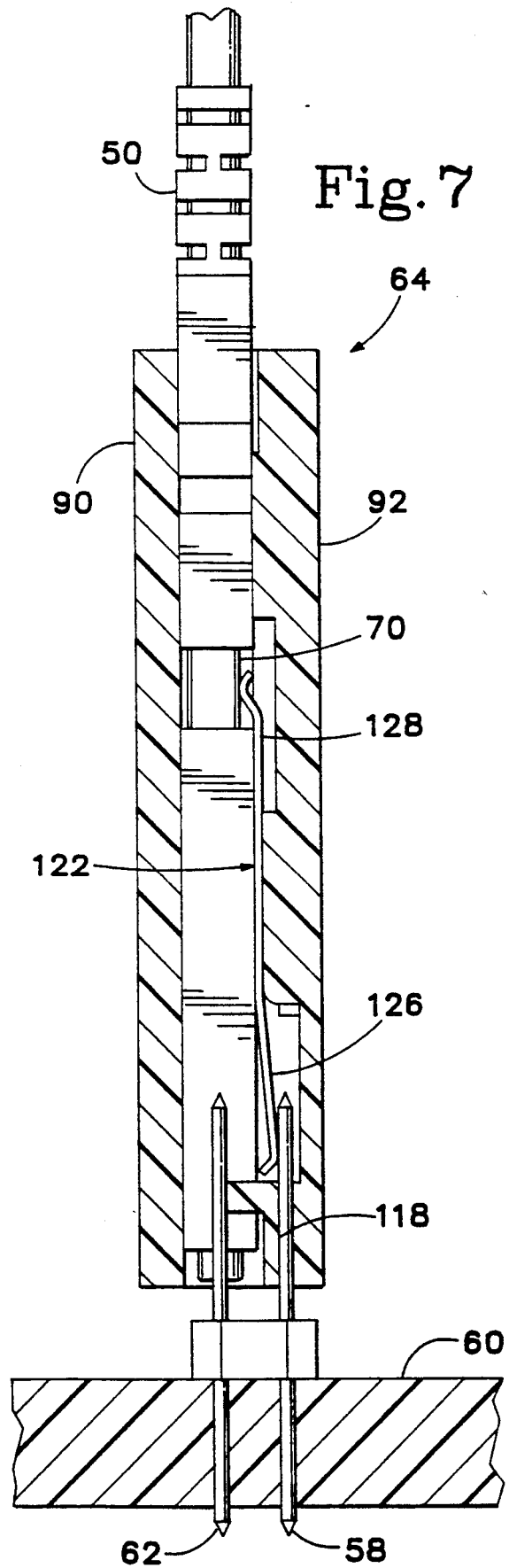

HIGH-SPEED, LOW-PROFILE TEST PROBE

BACKGROUND OF THE INVENTION

The present invention related to electrical test probes and more specifically to a high-speed, low-profile logic analyzer test probe having reduced inductive and capacitive loading.

Logic analyzer test probes are specialized types of voltage test probes that are optimized for probing digital and computer boards. Square pins are added to these boards to access logic signals and often have ground pins next to the signal pins for high speed signal acquisition. Instead of having a probing tip as in conventional voltage probes, a logic analyzer probe has a socket connector for mounting the probe on a signal pin. A signal wire leads from the logic analyzer probe to a interface pod, which is coupled to the input channels of the logic analyzer. Depending on the bandwidth requirements of the logic analyzer, passive or active circuitry may be included in the probe. In addition, the probe may contain a ground connection to the device under test to reduce capacitive loading.

FIGS. 1A–D show examples of prior art logic analyzer test probes. The simplest type of logic analyzer probe is shown in FIG. 1A. The probe 10 has a probing head socket connector 12 connected to a length of wire 16, which connected to the interface pod 18. Depending on the design of the logic analyzer, the interface pod 18 may contain circuitry for providing a high input impedance to the device under test (DUT), amplification of the acquired signal, and signal timing. Shrink wrap material 20 is formed over the socket 12 to provide electrical insulation. A second probe 22 is required to provide the ground connection to the DUT. This type of probe is very good for probing tight spaces but has very high inductive and capacitive loading due to the long lead lengths from the probing head 12 to the interface pod 18 and from the ground probe 22 to the probe head 12.

Probes 24 and 26 of FIGS. 1B and 1C partially overcome the inductive and capacitive loading problem of the previous probe 10 by providing high input impedance circuitry in a probe head podlet 28. In addition, the podlets 28 have a molded-in socket 30 for connecting the probes 24 and 26 to the ground of the DUT. The high input impedance circuitry and ground connection of the probes 24 and 26 are encapsulated in an insulating material forming the podlets 28. The podlets 28 are electrically connected to the interface pod 18 via twisted pair wires 34. In use, multiple podlets 28 are connected to the interface pod 18 with the maximum number of podlets being equal to the maximum number of channels for the acquisition circuitry of the logic analyzer.

In probe 24 of FIG. 1B, a wire 36 extends from the podlet 28 to a socket connector 38 which is used for probing the device under test. The wire 36 is connected to the compensating circuitry in the podlet 28. A ground socket 42 and wire 44 are connected to the molded-in ground socket 30 in the podlet 28 for coupling the DUT ground to the probe. While this type of probe has substantially increased bandwidth, inductive and capactive loading is still present due to the wire leads 36 and 44 extending from the podlet 28 to the signal test point and to the DUT ground. In addition, each probe socket 38 and ground socket 42 must be individually placed on test and ground pins of the DUT. With logic analyzers having the capability to receiving data over hundreds of channels at a time, it becomes very time consuming for an operator to individually connect each probe and ground connection to the DUT.

Probe 26 of FIG. 1C overcomes the problems of the previous probe by molding the probing socket 38 in the podlet 28 adjacent to the ground socket 30. This minimizes the inductive and capacitive loading caused by the external wire leads 36 and 44 used in the previous probe. In addition, the form factor of podlet 28 allows multiple podlets to be ganged together to form a multichannel probe 46 as is shown in FIG. 1D. The major drawback to this type of probe is that it designed for use with logic and computer boards that have double rows of test pins on an industry standard of one hundred mil centers. For testing individual pins that may not have an associated ground pin on a one hundred mil center, a lead adapter 48 must be used. This results in a probe having the same inductive and capacitive loading as the previous probe.

As can be seen, there are trade-offs in the design of current logic analyzer probes. To maintain ease of use for probing individual test pins of a DUT, sacrifices have to be made with regard to inductive and capacitive loading as well as multichannel probing. To minimize inductive and capacitive loading and provide multichannel probing, sacrifices have to be made with regard to the ease of use in probing individual pins. What is needed is a logic analyzer probe that has the ease of use of probes designed for probing individual pins on a device under test while at the same time minimizing inductive and capacitive loading and providing multichannel probing of a device under test.

SUMMARY OF THE INVENTION

Accordingly, the present invention is a high-speed, low-profile test probe having reduced inductive and capacitive loading that is usable for both individual signal probing and multichannel probing. The test probe includes an elongate narrow substrate having a socket tip mounted thereon for connecting to a signal test pin of a device under test. The substrate has electrical circuitry disposed thereon providing a high input impedance to an electrical signal on the signal test pin. The substrate further includes an area of electrically conductive material deposited thereon for providing a conductive surface that is electrically connected to a ground test pin of the device under test. The socket tip and the substrate is surrounded by a body of insulating material that provides electrical isolation and protection for the probe components. A notch is formed in the insulating material for exposing a portion of the conductive surface on the substrate that provides the electrical connection to the ground test pin.

In a further aspect of the invention means are provided for ganging multiple high-speed, small profile test probes together to provide a multichannel test probe. The ganging means includes a housing having an open ended chamber formed therein for receiving a plurality of probes with the socket tips of the probes being exposed in one end of the housing. The housing has a plurality of apertures formed in the same end of the housing as the probe socket tips and are adjacent to the chamber. The apertures and the socket tips are in fixed parallel alignment with each other with the apertures receiving electrically grounded test pins on the device under test and the probe sockets receiving the test signal pins. An electrically conductive clip is disposed within the housing for providing electrical connections between the exposed conductive surfaces on the plurality of probes and electrically grounded test pins disposed within the housing apertures.

The objects, advantages and novel features of the present invention are apparent from the following detailed description when read in conjunction with appended claims and attached drawings.

BRIEF DESCRIPTION OF THE DRAWINGS

FIG. 5 is a side-sectional view of the probe holder according to the present invention.

FIG. 7 is a side sectional view of the probe holder connected to a device under test according to the present invention.

DETAILED DESCRIPTION OF THE PREFERRED EMBODIMENT

Figure 1A:
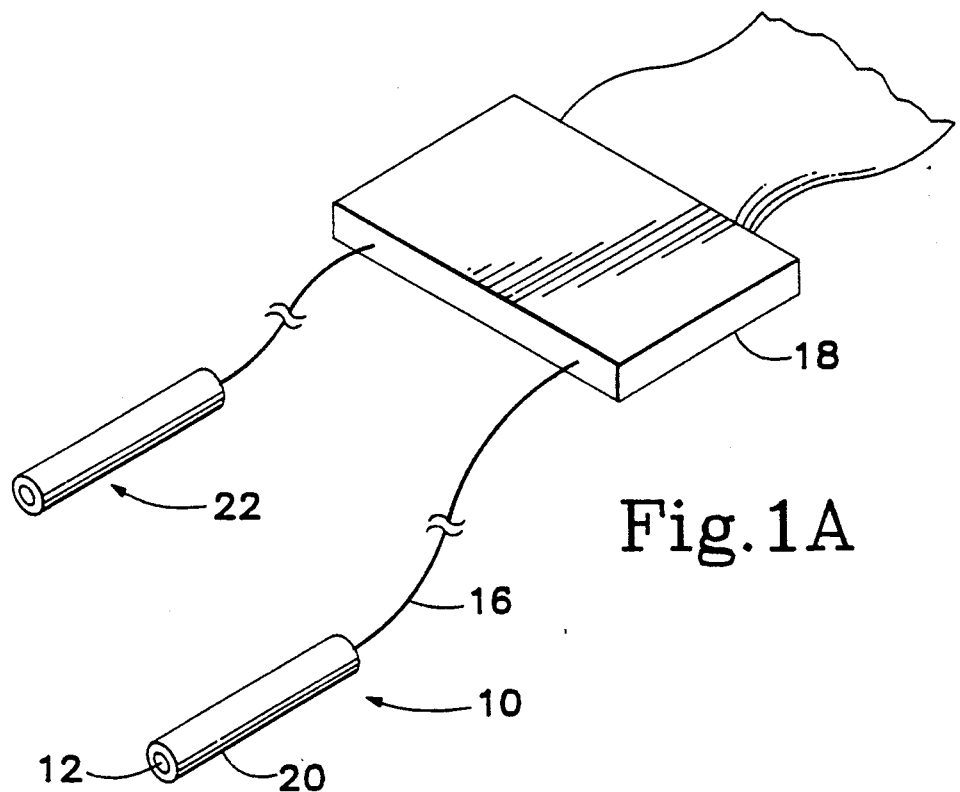
FIGS. 1A-1D are prior art logic analyzer probes.
Figure 1B:
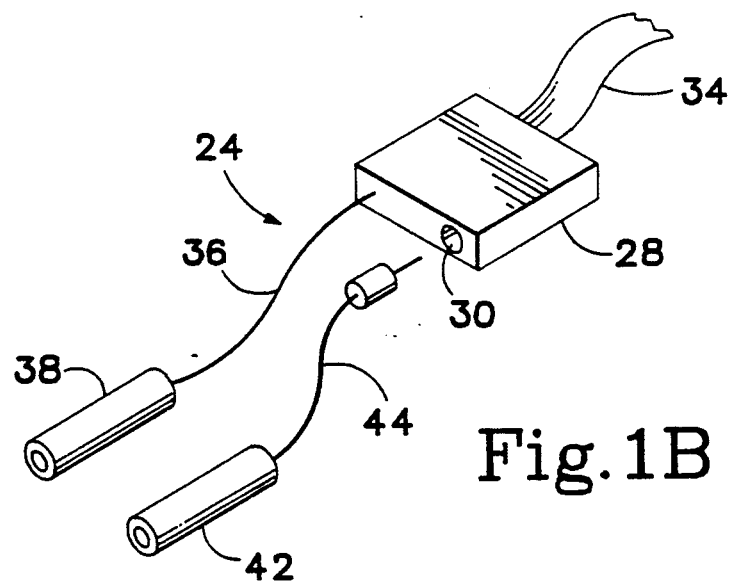
Figure 1C:
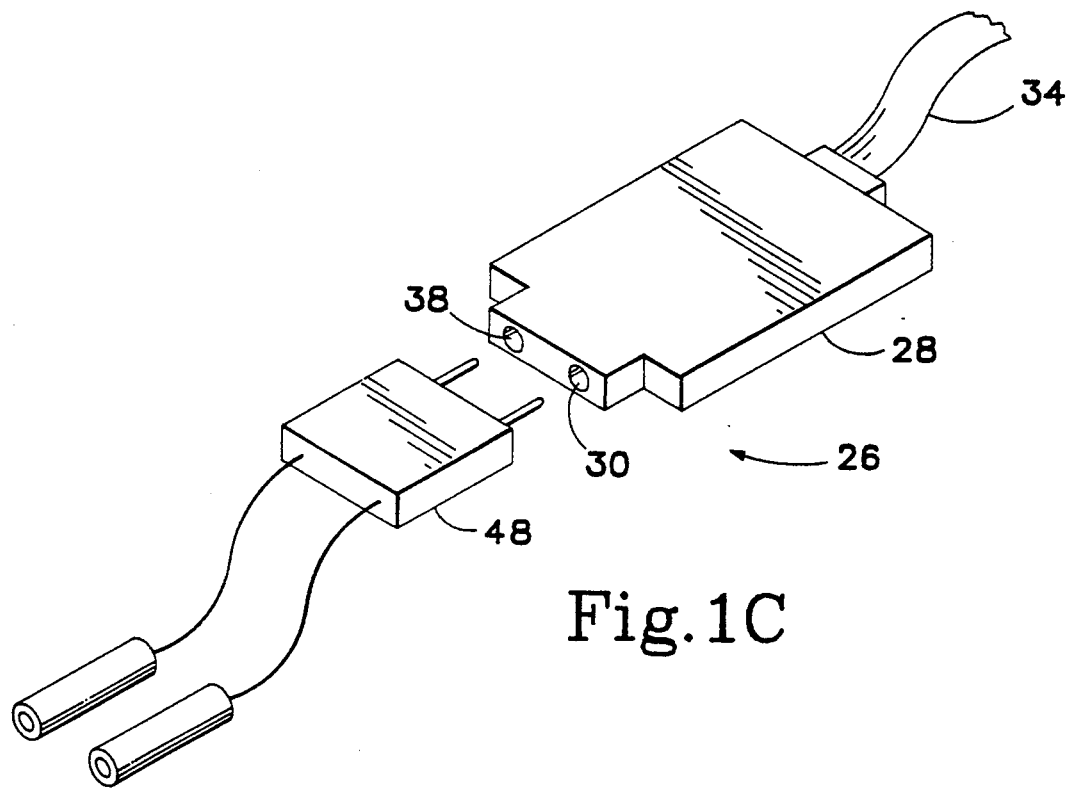
Figure 1D:
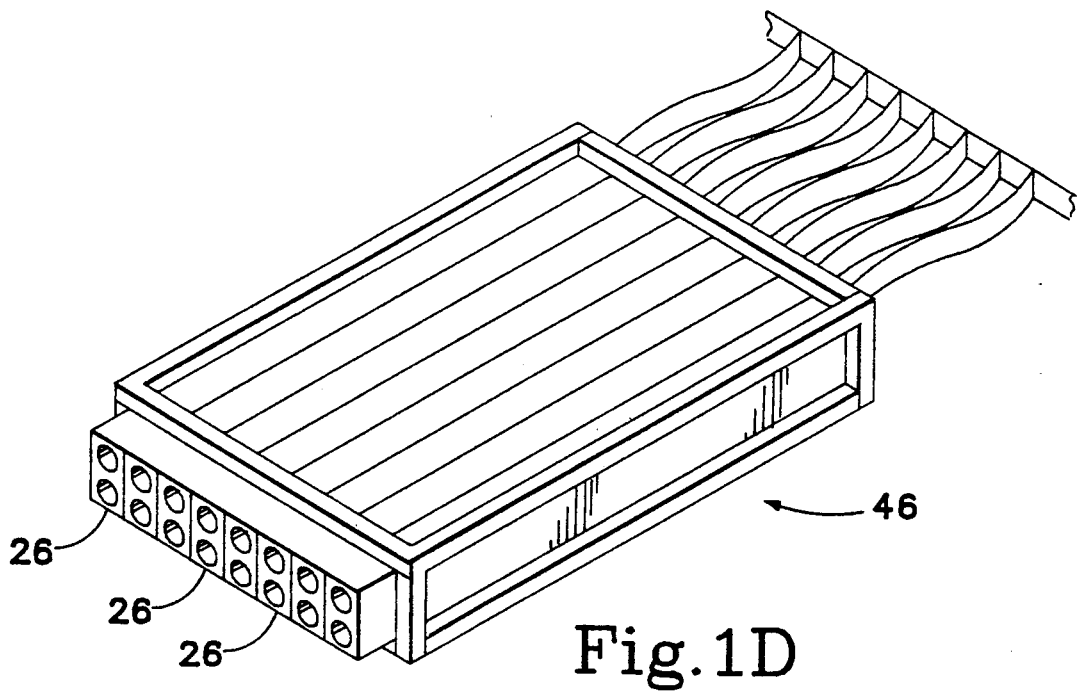
Figure 2:
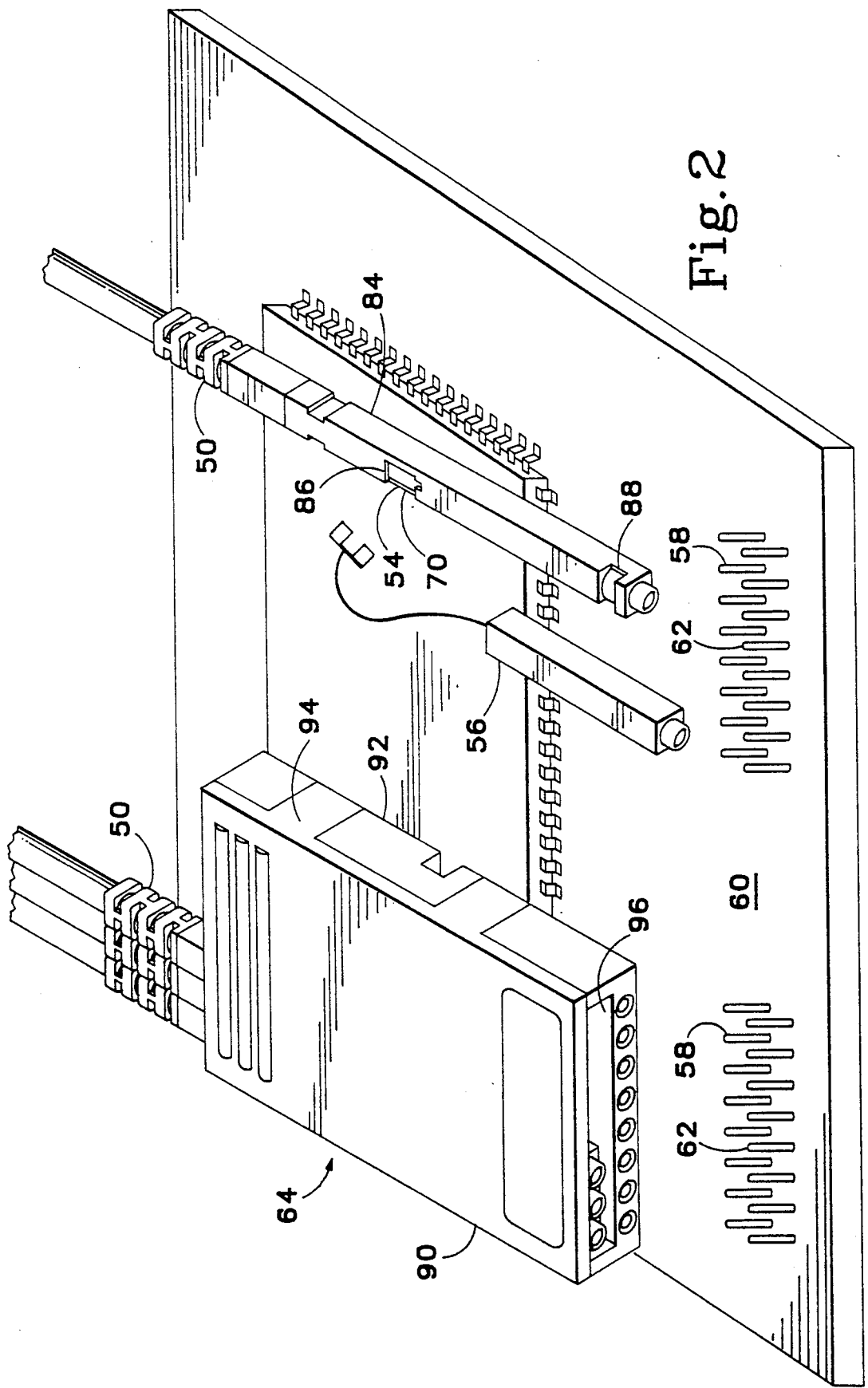
FIG. 2 are perspective views of the high-speed, low-profile test probe and probe holder for multichannel probing according to the present invention.

FIG. 2 shows the high-speed, low-profile logic analyzer probe 50 of the present invention having the ease of use associated with low bandwidth single pin probes while at the same time incorporating electrical circuitry and a device under test ground connection associated with high bandwidth probes. The integrally formed ground sockets 30 in the prior art high bandwidth probe head podlets 28 are eliminated in probe 50 and replaced with an exposed, integrally formed ground connection 54. This allows the form factor of probe 50 to be equivalent to that of low bandwidth prior art probes having no electrical circuitry in the probe. The integrally formed ground connection 54 accepts a ground lead 56 that is placed on a ground pin 58 of a device under test (DUT) 60 while the probe 50 is directly connected to individual signal pins 62 of the DUT 60. Inductive and capacitive loading of the test signal at the probe is reduced as a function of reducing the lead length between the signal socket and the ground socket. Probe 50 also has the advantage of being able to be ganged together in a probe holder 64 for multichannel probing.

Figure 3:
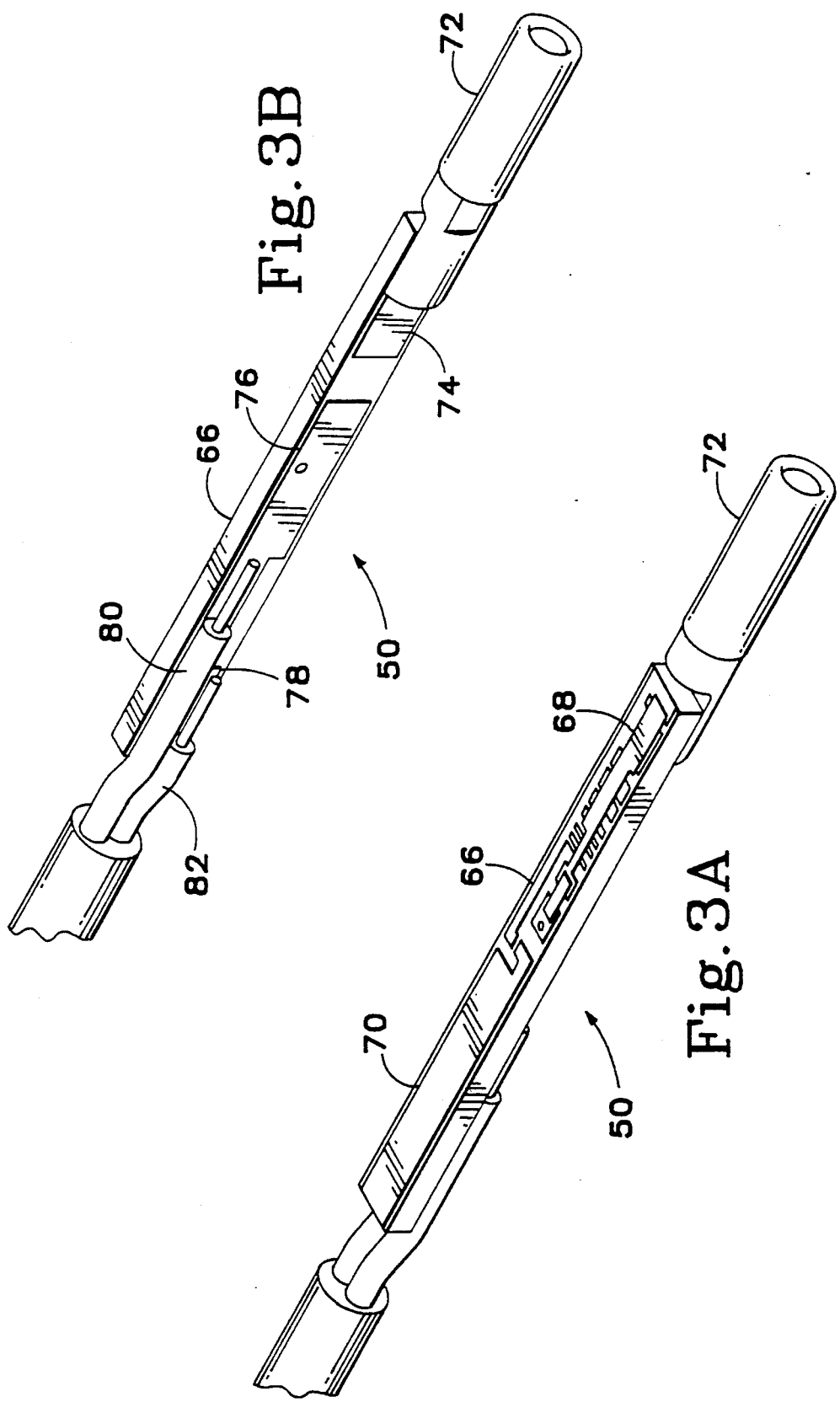
FIGS. 3A-B are top and bottom perspective views of the components in the high-speed, low-profile test probe according to the present invention.

Referring to FIGS. 3A and 3B, there are shown respective top and bottom views of the internal components of the high-speed, low-profile test probe 50 of the present invention. Probe 50 has an elogate narrow substrate 66 formed from a non-conductive material, such as a ceramic hybrid material or the like. Electrical circuitry 68 is formed on the substrate 66 for providing a high input impedance to an input electrical signal from the DUT 60. The circuitry 68 may be in the form of thin or thick film electrical components or surface mounted devices. Electrically conductive material is deposited on the substrate 66 to form a conductive surface 70 for connecting signal ground from the DUT to the substrate 66. A socket connector 72 is mounted on bonding surface 74 of substrate 66 and is electrically connected to circuitry 68. Bonding surfaces 76 and 78 are formed on the substrate 66 for respectively connecting signal and ground wires 80 and 82 to the substrate 66. The other ends of the wires 80 and 82 are connected to an interface pod (not shown), which is connected to a logic analyzer. Bonding surface 76 is electrically connected to receive the output signal from the electrical circuitry 68 and bonding surface 78 is electrically connected to the conductive surface 70.

The internal components of the probe 50 are surrounded by a body of insulating material 84 as shown in FIG. 2. The insulating material 84 provides electrical isolation and protection for substrate 66 and components mounted thereon. A notch 86 is formed in the insulating material 84 to expose a portion of the conductive surface 70 formed on the substrate 66. The detachable ground connector 56 may be connected to the conductive surface 70 at the notch 86 to couple the signal ground of the DUT 60 to the probe 50. In addition, the probe holder 64, to be described in greater detail below, has a ground spring that connects to the conductive surface 70. A second notch 88 may be formed in the insulating material 84 near the socket tip 72 for positioning the probe 50 in the probe holder 64.

Figure 4:
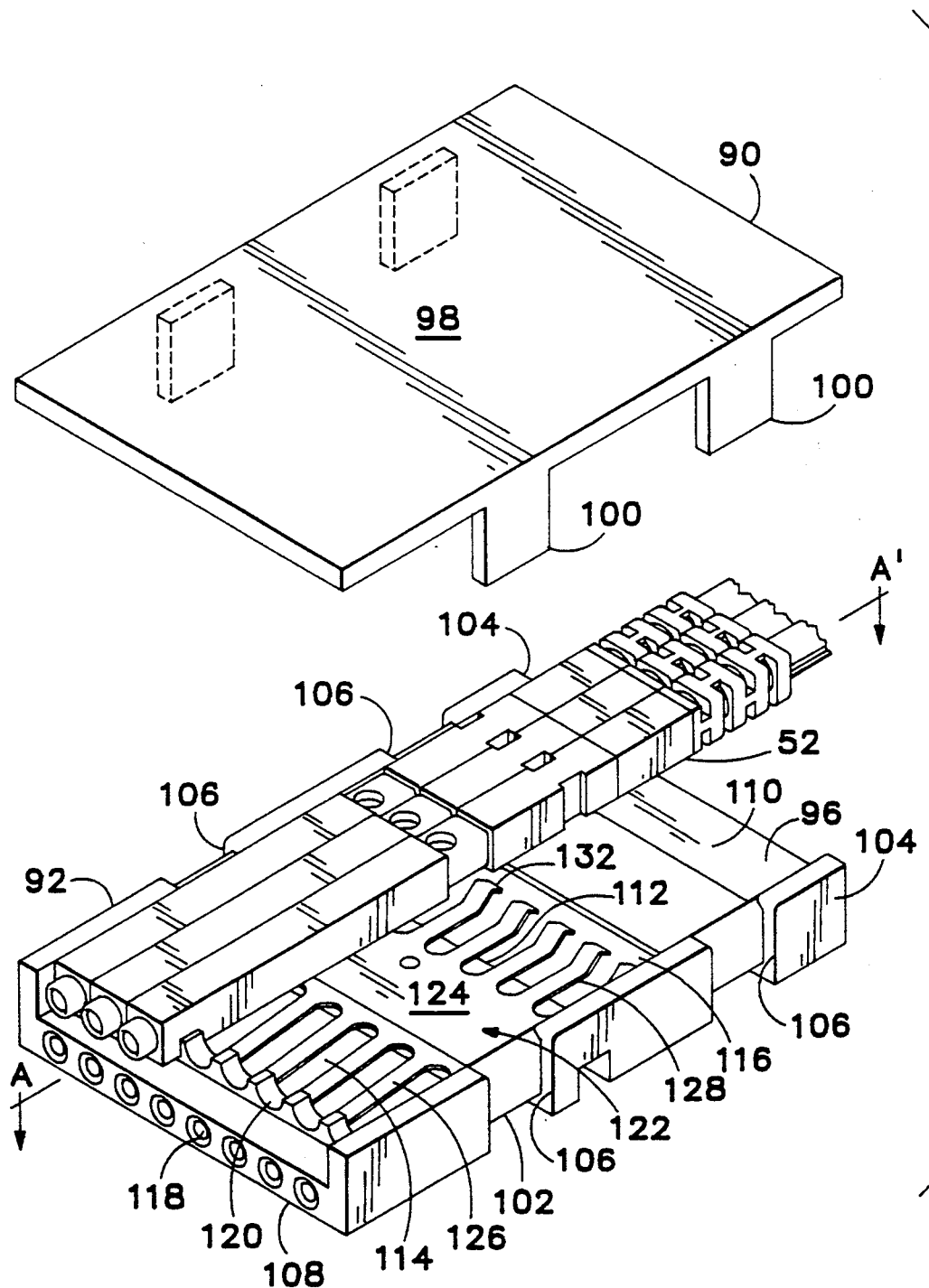
FIG. 4 is an exploded perspective view of the probe holder for the high-speed, low-profile test probe according to the present invention.

The form factor of the probe 50 allows it to be used in probing signal pins positioned in tight locations on a DUT while at the same time providing a DUT ground connection having a minimum of capacitive loading. In addition, the form factor of probe 50 allows multiple probes 50 to be adapted for use in the probe holder 64 for multichannel probing. The perspective view of FIG. 2 shows the probe holder 64 having top and bottom sections 90 and 92 forming a housing 94 having an open ended chamber 96 for receiving the probes 50. The top section 90 has a flat surface 98 with locking tabs 100 formed along two sides as shown in FIG. 4. The bottom section 92 has a base 102 with upstanding sidewalls 104 along two sides. The sidewalls 104 have grooves 106 formed therein for accepting the tabs 100 on the top section 90. The base 102 has raised end sections 108 and 110 separated from a raised center section 112 by chambers 114 and 116. The raised sections 108, 110, and 112 along with the chambers 114 and 116 extend between the sidewalls 104. The raised end section 108 has a rectangular cross-sectional shape with apertures 118 formed therein that are parallel to the sidewalls 104 and extend through to the chamber 114. A series of concave protrusions 120 are formed on top of the end section 108. The notches 88 on the probes 50 mate with the concave protrusions 120 to accurately position the probes 50 in the probe holder 64. In the preferred embodiment, the probe holder 64 can hold up to eight probes 50 in parallel alignment with the apertures 118 formed in the end section 108.

Mounted on the raised center section 112 is an electrically conductive spring clip 122. Clip 122 has a solid center section 124 with spring biased fingers 126 and 128 extending in opposite directions from the center section 124. Each pair of opposing fingers 126 and 128 are aligned with one of the apertures 118 formed in end section 108. Fingers 126 angle down from the center section 124 into chamber 114 as shown in the side-sectional view of FIG. 5. The ends of fingers 126 are bent upward forming an apex 130. Fingers 128 extend into chamber 116 and have upwardly extending curved contacts 132 formed in their ends.

The probe holder 64 is shown in the figures as holding up to eight probes 50. The probe holder 64 may equally be made to accept more or less probes without departing from the scope of the invention as set forth in the appended claims. The combination of probes 50 and the probe holder 64 is designed to mate with square pins having an industry standard one hundred mil spacing. Generally in logic signal probing, a row of signal pins on one hundred mil centers are provided on the logic or computer board. Adjacent to and parallel with the row of signal pins is a row of ground pins with each ground pin being spaced one hundred mils away from a signal pin. Probes 50 are placed in the probe holder 64 with the notches 88 mating with the concave protrusions 120 on the raised end section 108 and the back ends of the probes 50 resting on the other end section 110. The probe's socket connectors 72 are in parallel alignment with the apertures 118 formed in the end section 108. Both the socket connectors 72 and the apertures 118 are spaced apart from each other on one hundred mil centers. The conductive surfaces 70 of each of the probes 50 that are exposed in the notches 86 engage one of the respective upwardly extending curved contacts 132 of the electrically conductive spring clip 122. The probes 50 are secured in the probe holder 64 by attaching the top section 90 on the bottom section 92 via clips 100.

Figure 6:
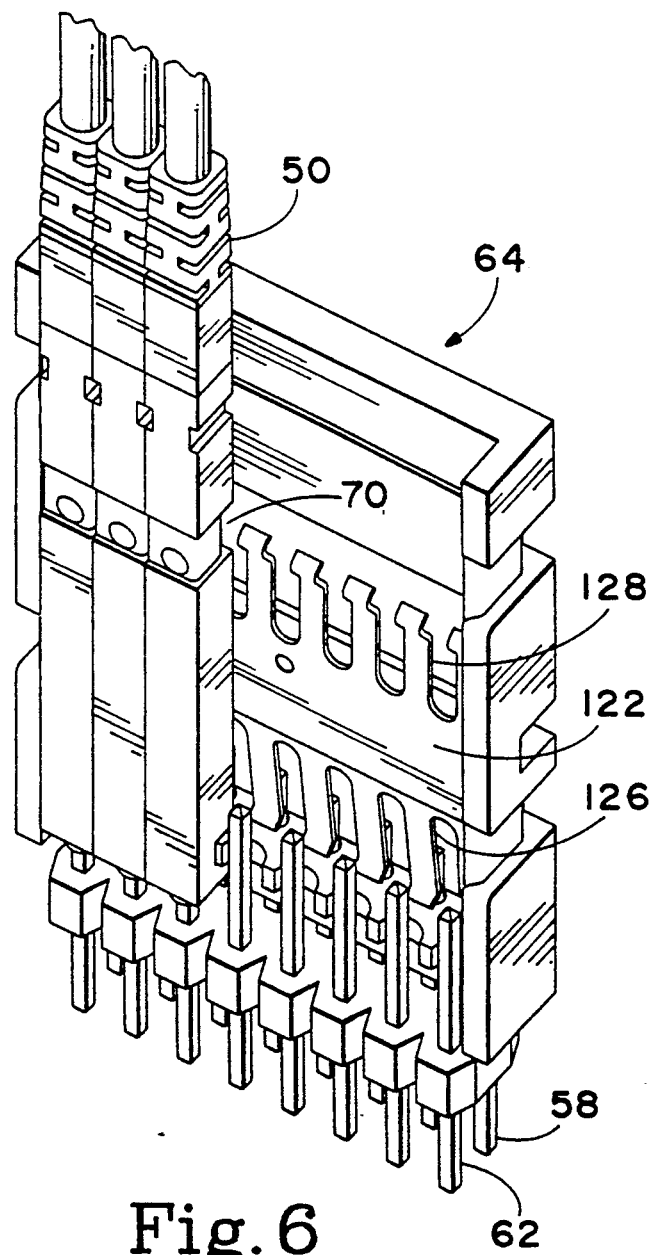
FIG. 6 is a perspective view without the top section of the probe holder connected to an array of signal pins according to the present invention.

The placement of multiple probes 50 in the probe holder 64 produces of multichannel probe capable of acquiring multiple signal from a device under test 60. As is shown in perspective view of FIG. 6 and the side-sectional of FIG. 7, the multichannel probe is placed on the DUT signal and ground pin array with each probe 50 being connected to a separate signal pin 62. The ground pins 58 extend through the apertures 118 in the probe holder 64 and make electrical contact with fingers 126 of the electrically conductive ground spring 122. The opposing fingers 128 of the ground spring 122 are electrically connected to the conductive surfaces 70 of the probes 50. The spring clip 122 provides direct contact between the individual conductive surfaces 70 of the probes 50 and their respective ground pins 58 on the device under test 60. The ground connections between the device under test 60, ground pins 58, and probe grounds 70 are therefore as short as possible permitting the maximum bandwidth to be obtained.

A high-speed, low-profile logic analyzer test probe has been described wherein a body of insulating material is molded directly onto a narrow elongate substrate having electrical circuitry disposed thereon. The molded insulating material has a notch formed therein for exposing a conductive surface formed on the substrate. The exposed conductive surface is used for making a ground connection between the substrate and the ground of a device under test. The probe has the ease of use associated with low bandwidth single pin probes while at the same time incorporating electrical circuitry and a device under test ground connection associated with high bandwidth probes. Further, the probe may be adapted for use in probe holder for multichannel probing wherein the probe holder has an electrically conductive chip disposed within the probe holder housing for providing the shortest possible ground connections between the ground pins on the device under test and the ground connections on the probes. These and other aspects of the present invention are set forth in the appended claims.

We claim:

1. A high-speed, low-profile test probe having reduced inductive and capacitive loading comprising:
    an elongate narrow substrate having a socket tip mounted thereon for connecting to a first test pin of a device under test with the substrate having electrical circuitry disposed thereon for providing a high input impedance to an electrical signal on the first test pin and an area of electrically conductive material deposited on the substrate for providing a conductive surface for connecting to a second test pin of the device under test; and
    a body of insulating material surrounding the socket tip and the substrate for providing electrical isolation and protection for the electrical circuitry, the body of insulating material having a notch formed therein for exposing a portion of the conductive surface on the substrate for providing the electrical connection to the second test pin.

2. The high-speed, low-profile test probe as recited in claim 1 wherein the conductive surface is connected to electrical ground on the device under test.

3. The high-speed, low-profile test probe as recited in claim 2 further comprising a ground lead having a clip disposed on one end for connecting to the conductive surface of the substrate at the notch in the body of insulating material and a socket tip disposed on the other end for engaging a ground pin of the device under test.

4. The high-speed, low-profile test probe as recited in claim 1 further comprising a probe holder for ganging a plurality of probes together to produce a multichannel probe set, the probe holder comprising:
    a housing having an open ended chamber formed therein for receiving the plurality of probes with the socket tips of the probes being exposed in one end of the housing with that end of the housing having a plurality of apertures formed therein adjacent to the chamber for receiving the second test pins on the device under test, the apertures and the socket tips being in fixed parallel alignment with each other; and
    an electrically conductive clip disposed within the housing for providing electrical connections between the exposed conductive surfaces on the plurality of probes and electrically grounded test pins disposed within the housing apertures.

5. The high-speed, low-profile test probe as recited in claim 4 wherein the electrically conductive clip further comprises a center section having integrally formed spring biased fingers extending in opposite directions therefrom with the fingers in one direction being angled downward and the fingers in the other direction having upwardly extending curved contacts formed therein.

6. The high-speed, low-profile test probe as recited in claim 5 wherein the housing further comprises:
    a top member having a flat surface with orthogonally depending tabs disposed on opposing sides of the flat surface; and
    a bottom member having a base with upstanding sidewalls formed on two sides, the sidewalls having grooves formed therein for receiving the tabs on the top member to secure the top member to the bottom member.

7. The high-speed, low-profile test probe as recited in claim 6 wherein the bottom member further comprises first and second raised end sections and a raised center section with the raised end sections being separated from the center section by first and second chambers, the first end section having the plurality of apertures therein and the center section having the electrically conductive clip mounted thereon with the fingers of the clip being disposed in the first and second chambers.

* * * * *